United States Patent
Wang et al.

(10) Patent No.: US 7,267,636 B2
(45) Date of Patent: Sep. 11, 2007

(54) STRUCTURE OF ROCKER ARMS WITH OPTICAL SENSING CONTROL FOR AN EXERCISE APPARATUS

(76) Inventors: Leao Wang, No. 1, Lane 233, Sec. 2. Charng Long Rd., Taiping City, Taichung Hsien 411 (TW); Peter Wu, No. 1, Lane 233, Sec. 2. Charng Long Rd., Taiping City, Taichung Hsien 411 (TW)

( * ) Notice: Subject to any disclaimer, the term of this patent is extended or adjusted under 35 U.S.C. 154(b) by 0 days.

(21) Appl. No.: 11/079,545

(22) Filed: Mar. 14, 2005

(65) Prior Publication Data
US 2006/0205567 A1 Sep. 14, 2006

(51) Int. Cl.
*A63B 22/04* (2006.01)
*A63B 22/00* (2006.01)
(52) U.S. Cl. ........................................ 482/52; 482/57
(58) Field of Classification Search ............ 482/51, 482/52, 54, 57, 70, 79, 1–9
See application file for complete search history.

(56) References Cited

U.S. PATENT DOCUMENTS

| | | | |
|---|---|---|---|
| 6,327,376 B1 * | 12/2001 | Harkin | 382/124 |
| 6,620,079 B2 * | 9/2003 | Kuo | 482/51 |
| 6,808,473 B2 * | 10/2004 | Hisano et al. | 482/8 |

* cited by examiner

*Primary Examiner*—Stephen R. Crow

(57) ABSTRACT

The invention relates to a structure of rocker arms with optical sensing control for an exercise apparatus. The rocker arm of an exercise apparatus includes a handgrip. At least an optical sensor in accordance with the invention is positioned within a finger groove of the handgrip. The finger groove is so constructed that its form corresponds to the finger pad of the finger of an operator. Meanwhile, the finger groove is provided with an aperture in which the optical sensing element is hidden. The optical sensing element is connected to a console of the exercise apparatus through a conducting wire for setting different functions (exercise speed, slope or resistance) by means of effective detection signals. Therefore, the exercise apparatus is operable by means that a finger of both hands is slightly moved at fixed point during the exercise session.

1 Claim, 1 Drawing Sheet

STRUCTURE OF ROCKER ARMS WITH OPTICAL SENSING CONTROL FOR AN EXERCISE APPARATUS

BACKGROUND OF THE INVENTION

1. Field of the Invention

The invention relates to a new and improved structure of rocker arms with optical sensing control for an exercise apparatus, and more particularly, to a structure through which the finger of the operator slightly moves at fixed point for achieving the control effect.

2. Description of the Related Art

A few of walking exercise apparatuses can be fitted with rocker arms for operators to grasp during the walking, jogging or running movement. Accordingly, both hands of the operator can be moved therewith.

U.S. Pat. No. 6,454,682 to Kuo discloses a conventional exercise apparatus providing with two arms. The top of the handgrip of the rocker arms includes a control button in connection with an electronic console for performing special functions (e.g. adjusting the slope or the resistance of the treadles). Therefore, the control is achieved only when one finger of both hands of the operator moves (in the way of "non-fixed point") and presses control button.

The above-mentioned configuration has its own merits. However, it also has drawbacks from the opinion of professionals. For example, the press-button control easily produces bad contact between components after being pressed for a longer period of usage. In brief, the service life thereof can be shorter than expected, thereby creating inconvenience in usage and troubles in maintenance.

Furthermore, the four limbs move in alternating succession during the exercise session. It leads to a great trouble when the operator must pay attention to if the position of the moving finger is correct or not. Even, the walking rhythm can be spoiled.

SUMMARY OF THE INVENTION

An object of the invention is to eliminate the above-mentioned drawbacks and to provide a structure of rocker arms with optical sensing control for an exercise apparatus. The conventional control button in touch way is replaced by an optical sensing element in non-contact way for protecting from damage of components due to over-contact and for elongating the life of the relevant components. Meanwhile, the control at fixed point can remove all interference during the exercise session. Accordingly, the original exercise rhythm won't be influenced, thereby reaching excellent and comfortable effects in usage.

BRIEF DESCRIPTION OF THE DRAWINGS

The accomplishment of this and other objects of the invention will become apparent from the following description and its accompanying drawings of which.

DETAILED DESCRIPTION OF THE PREFERRED EMBODIMENT

Figure 2:
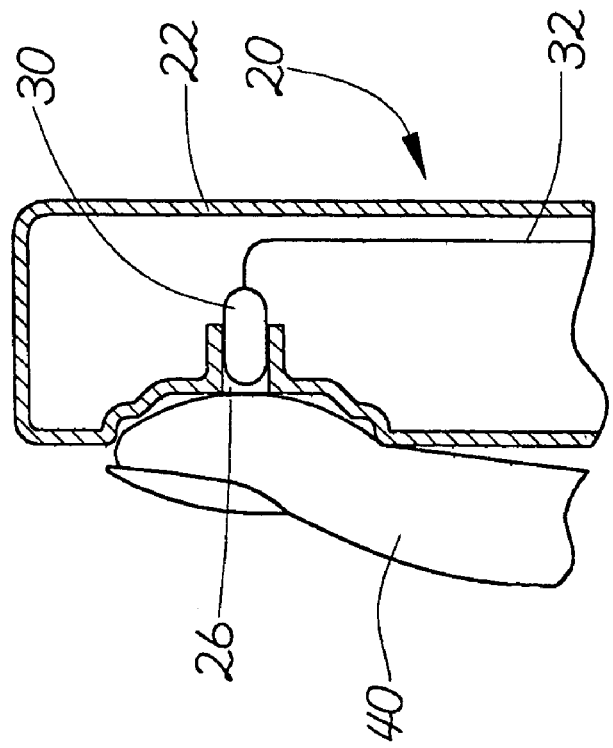
FIG. 2 is a schematic drawing of the preferred embodiment of the invention, showing the operation thereof.
Figure 1:
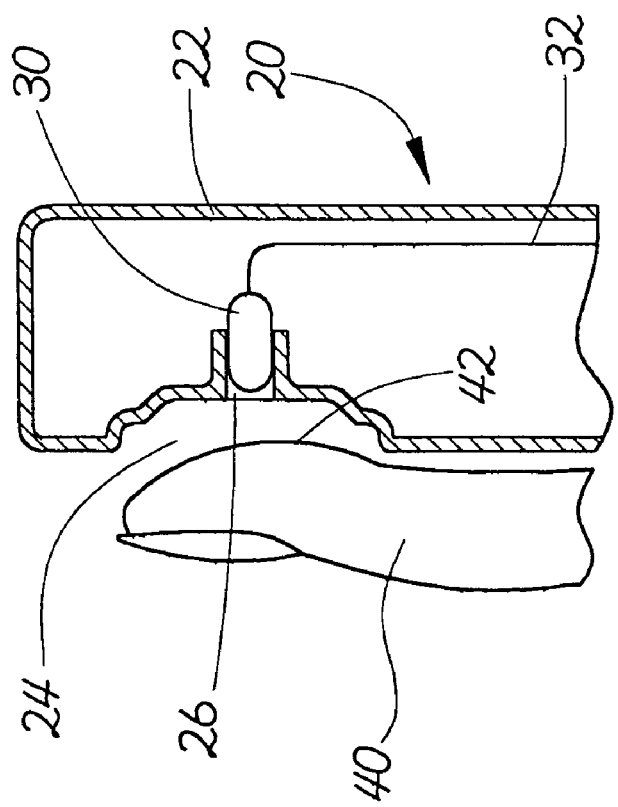
FIG. 1 is a schematic drawing of a preferred embodiment of the invention.

First of all, referring to FIGS. 1 and 2, a preferred embodiment of the invention is shown. The rocker arm 20 of a conventional exercise apparatus includes a handgrip 22. At least an optical sensor 30 in accordance with the invention is positioned within a finger groove 24 of the handgrip 22. The finger groove 24 is so constructed that its form corresponds to the finger pad 42 of the finger 40 of an operator. Meanwhile, the finger groove 24 is provided with an aperture 26 in which the optical sensing element 30 is hidden. The optical sensing element 30 is connected to a console of the exercise apparatus through a conducting wire 32 for setting different functions (exercise speed, slope or resistance) by means of effective detection signals. Therefore, the exercise apparatus is operable by means that a finger 40 of both hands is slightly moved at fixed point during the exercise session.

The above-mentioned "effective detection signal" means that the optical sensing element 30 receives continuous signals of external light to be blocked and coming through within a predetermined time, e.g. one second. That is, the operator uses the finger pad 42 of the finger 40 to cover and uncover the aperture 26 within the predetermined time. When an effective detection signal is created, a microprocessor within the console performs control operation according to the preset commands.

When the optical sensing element 30 repetitively receives the light-uncovered or light-covered signals beyond the preset time, it is considered as a false signal and no reaction is produced. Therefore, when the finger pad 42 of the finger 40 of an operator covers or leaves the aperture 26 for a long time, no control effect on the exercise apparatus is created.

In addition, the present invention can be provided with a hidden speaker (not shown). After the optical sensing element 30 receives an effective detection signal, a sound is given to inform the operator of an effective control action. Moreover, the high or low and long or short tone can be used to distinguish different operational modes from one another. This is one of the most suitable ways for the visually handicapped.

Furthermore, both rocker arms 20 of the exercise apparatus can be so constructed that the optical sensing element 30 of one rocker arm 20 is responsible for the positive sensing control (e.g. for acceleration or increasing resistance). Meanwhile, the optical sensing element 30 of the other rocker arm 20 is responsible for the negative sensing control (e.g. deceleration or decreasing resistance). Therefore, the operator can easily and smoothly perform the control operation.

Many changes and modifications in the above-described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A structure of a rocker arm with optical sensing control for an exercise apparatus, comprising:
   a) a finger groove located on a handgrip of the rocker arm of the exercise apparatus and corresponding to a form of a finger pad of a finger of an operator and receiving the finger;
   b) an optical sensing element connected to a console of the exercise apparatus through a conducting wire for setting different functions by means of effective detection signals; and
   c) an aperture located on a bottom of the finger groove for accommodating the optical sensing element,
   wherein the effective detection signals include a plurality of different signals dependent upon placement and time duration of the finger,
   whereby the exercise apparatus is operable when the finger is slightly moved at fixed point during the exercise session.

* * * * *